United States Patent [19]

Arakawa

[11] Patent Number: 5,111,159

[45] Date of Patent: May 5, 1992

[54] AMPLIFIER CIRCUIT WITH OPEN-LOOP GAIN THAT CAN BE VARIED WITH RESPECT TO CLOSED-LOOP GAIN

[75] Inventor: Hiroshi Arakawa, Yokohama, Japan

[73] Assignee: Kabushiki Kaishi Toshiba, Kawasaki, Japan

[21] Appl. No.: 665,471

[22] Filed: Mar. 6, 1991

[30] Foreign Application Priority Data

Mar. 9, 1990 [JP] Japan ................................ 2-58443

[51] Int. Cl.⁵ .............................................. H03G 3/10
[52] U.S. Cl. ........................................ 330/254; 330/278
[58] Field of Search ............... 330/129, 131, 252, 254, 330/260, 261, 278, 285; 357/74

[56] References Cited

U.S. PATENT DOCUMENTS 3,851,270  11/1974  Vosteen ........................... 330/260 X
4,847,567   7/1989  Fenk ................................. 330/254
5,001,439   3/1991  Lopata et al. .................... 330/257 X Primary Examiner—Steven Mottola
Attorney, Agent, or Firm—Finnegan, Henderson, Farabow, Garrett and Dunner

[57] ABSTRACT

An operational amplifier circuit has an inverting and a noninverting input terminal and an output terminal and a current source circuit. A signal output from the output terminal is fed back to the inverting input terminal via a resistor for setting a closed-loop gain of the amplifier. To a part of a current path of the current source circuit is connected a resistor for changing the current of the current circuit to set an arbitrary open-loop gain of the amplifier.

8 Claims, 5 Drawing Sheets

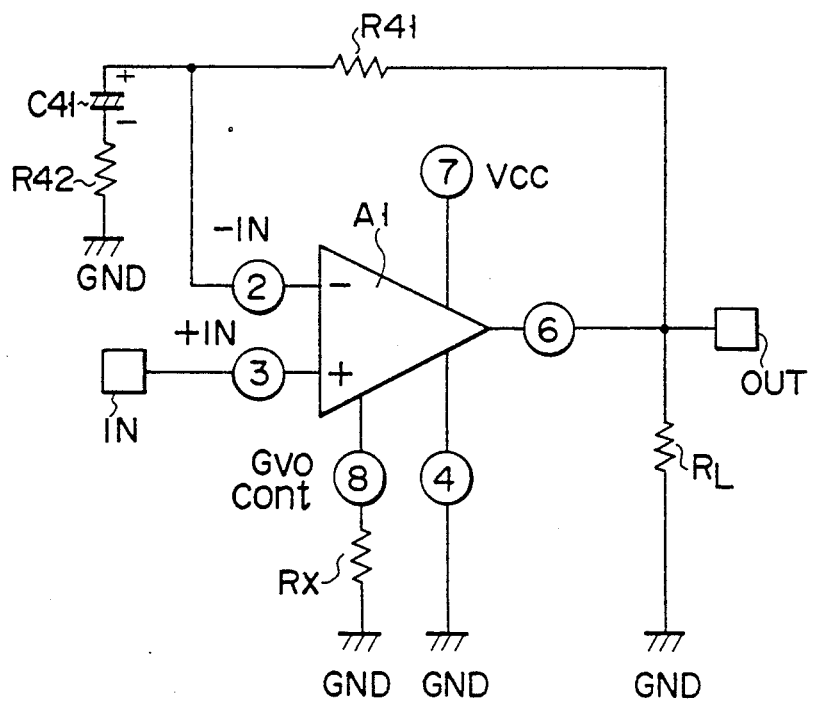
F I G. 3
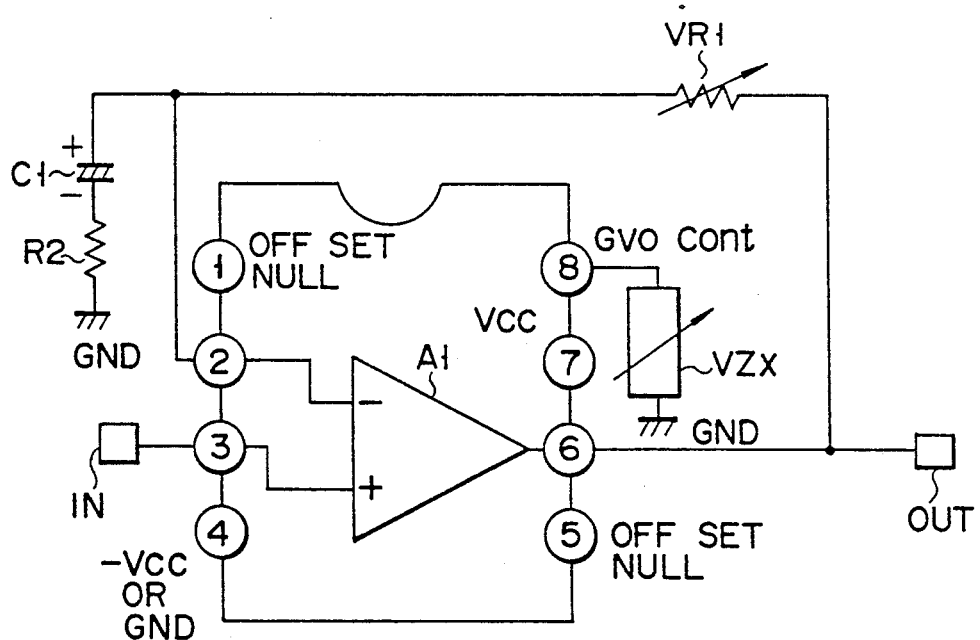
F I G. 4

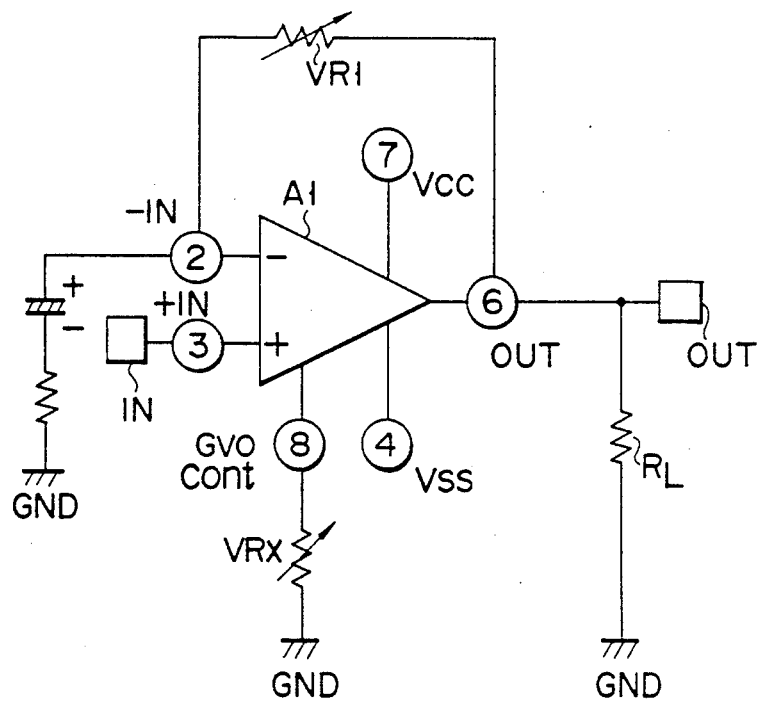
F I G. 5
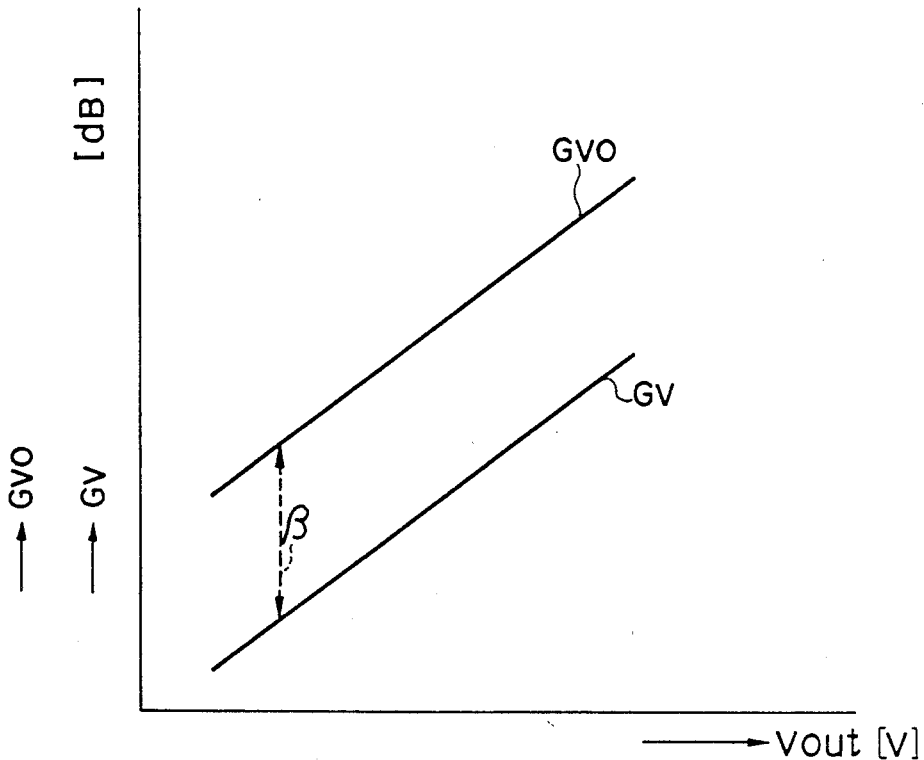
F I G. 6

AMPLIFIER CIRCUIT WITH OPEN-LOOP GAIN THAT CAN BE VARIED WITH RESPECT TO CLOSED-LOOP GAIN

BACKGROUND OF THE INVENTION

1. Field of the Invention

The present invention relates to an amplifier circuit and, more particularly, to a low-frequency negative-feedback amplifier circuit using an operational amplifier.

2. Description of the Related Art

In general, a general-purpose amplifier, such as an operational amplifier (hereinafter referred to as an op amp), has a constant open-loop voltage gain (hereinafter referred to as Gvo) even if its closed-loop voltage gain (hereinafter referred to as Gv) is selected to be an arbitrary value when it is actually used.

FIG. 7 illustrates such an op amp, in integrated-circuit form, which is used as a noninverting amplifier.

An op amp A7 is housed in a package 51, which is equipped with terminals 1 and 5 adapted to adjust an offset voltage, a terminal 2 serving as the inverting input terminal of the op amp, a terminal 3 serving as the noninverting input terminal of the op amp, a terminal 4 connected to a negative power supply ($-Vcc$) or ground potential (GND), a terminal 6 serving as the output terminal of the op amp, a terminal 7 connected to supply voltage (Vcc) and a preliminary terminal 8.

The terminal 3 of the package 51, which is connected to the noninverting input terminal of the op amp A7, is connected to the sliding contact of a variable resistor VR71 adapted to vary the level of an input signal. The variable resistor VR71 has its end connected to an input terminal IN and its other end connected to ground. The terminal 2 of the package, which is connected to the inverting input terminal of the op amp A7, is connected to an output terminal OUT via a feedback resistor R71 and to ground via a series combination of a feedback capacitor C71 and a feedback resistor R72. The above-mentioned Gv is determined by a ratio of R71 and R72.

In the above amplifier, Gvo is constant, while Gv may be set arbitrarily by users. For this reason the following problems will arise.

First, in the case where Gv is set relatively high, say, 70–80 dB when Gvo=100 dB (constant), a state akin to the state without feedback will result. In this case, therefore, distortion will increase and frequency characteristics will deteriorate.

Second, if Gv is set relatively low, say, 0–10 dB when Gvo=100 dB, stability decreases and thus oscillation is apt to occur.

In order to solve the first problem, therefore, it is required that Gvo should be further increased relative to Gv. Also, in order to solve the second problem, it is necessary that Gvo be further decreased relative to Gv.

In the prior art, as shown in FIG. 7, the high-impedance variable resistor VR71 is connected to the terminal 3, serving as the noninverting input terminal of the op amp, so as to adjust the input signal level.

With such an arrangement, however, the impedance seen by the input terminal becomes necessarily high and moreover the variable resistor itself serves a source of noise because it involves thermal noise. The noise level is at a maximum when the sliding contact of the variable resistor VR71 is set at its middle point.

SUMMARY OF THE INVENTION

It is an object of the present invention to provide an amplifier which is free from a noise source, provides a low input impedance and is adaptable to various applications.

According to the present invention there is provided an amplifier circuit comprising:
  an operational amplifier having an inverting and a noninverting input terminal and an output terminal, the operational amplifier including a current source circuit;
  a feedback circuit for feeding a signal output from the output terminal back to the inverting input terminal to set a closed-loop gain of the amplifier circuit; and
  a load connected to part of a current path of the current source circuit for changing a current provided by the current source circuit to set an open-loop gain of the amplifier circuit.

According to the present invention, by connecting a load to the current source circuit of the operational amplifier without connecting an attenuator to the input terminal, the open-loop voltage gain can be adjusted according to the closed-loop voltage gain. Therefore, the input impedance of the amplifier circuit can be made low and a noise source can be removed.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 illustrates a specific arrangement of the circuit of FIG. 1;

FIG. 4 is a schematic diagram of an amplifier according to another embodiment of the present invention;

FIG. 5 illustrates a specific arrangement of the circuit of FIG. 4;

FIG. 6 is a graph illustrating a relationship between the closed-loop voltage gain and the open-loop voltage gain of the circuit of FIG. 5.

DETAILED DESCRIPTION OF THE PREFERRED EMBODIMENTS

Figure 1:
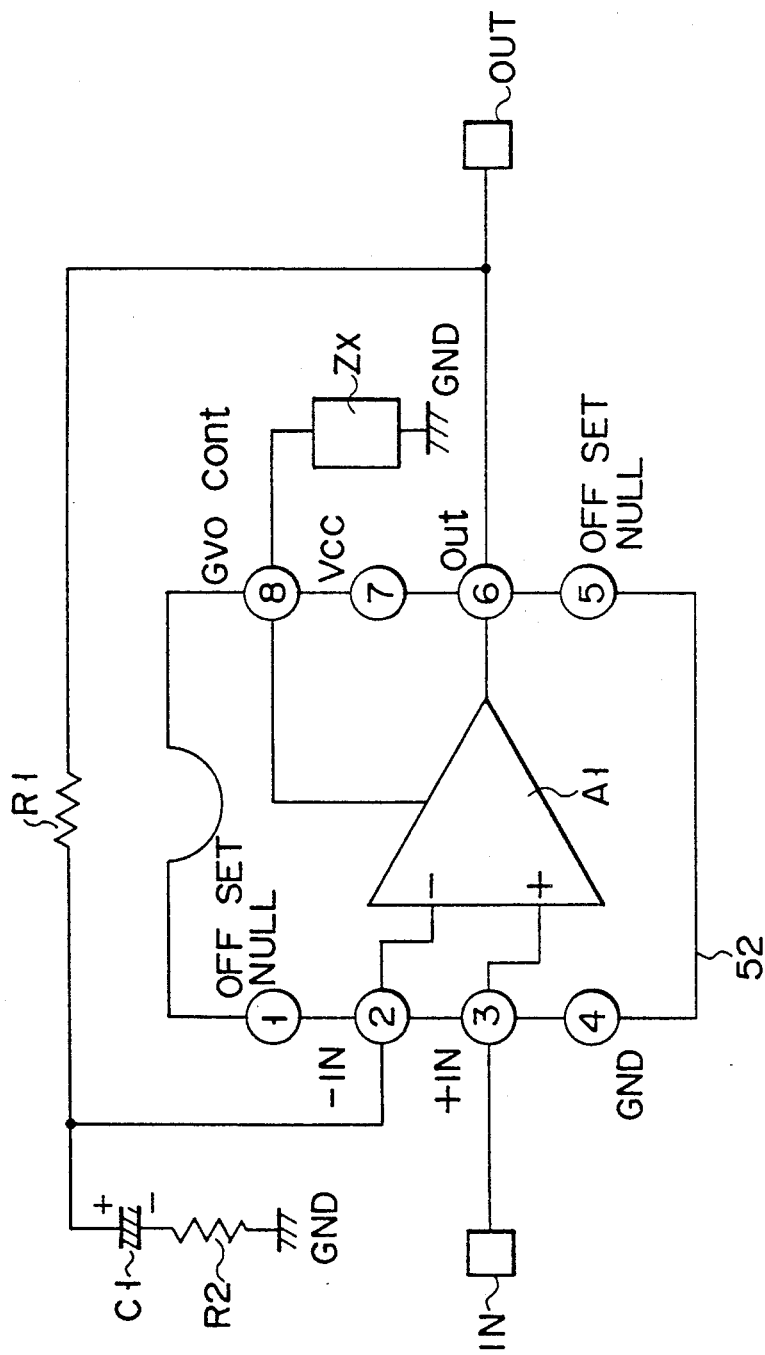
FIG. 1 is a schematic diagram of an amplifier according to an embodiment of the present invention.

Referring now to FIG. 1, there is shown a noninverting amplifier using an op amp according to an embodiment of the present invention.

An op amp A1 is housed in a package 52. The package is equipped with terminals 1 and 5 adapted to adjust an offset voltage, a terminal 2 serving as the inverting input terminal of the op amp, a terminal 3 serving as the noninverting input terminal of the op amp, a terminal 4 connected to a negative power supply ($-Vcc$) or ground potential (GND), a terminal 6 serving as the output terminal (OUT) of the op amp, a terminal 7 connected to supply voltage (Vcc) and a preliminary terminal 8.

The terminal 3 of the package 52, which is connected to the noninverting input terminal of the op amp A1 is connected to an input terminal IN. The terminal 2 of the package, which is connected to the inverting input terminal of the op amp A1, is connected to the terminal 6 and an output terminal OUT via a feedback resistor R2 and to ground via a series combination of a feedback capacitor C1 and a feedback resistor R2. The closed-loop voltage gain Gv is determined by the ratio of R1 and R2. Furthermore, the preliminary terminal 8 is used as a control terminal (Gvo Cont) for Gvo and is connected to ground via a load Zx adapted to adjust Gvo. The load Zx permits the open-loop voltage gain Gvo to be varied.

Figure 2:
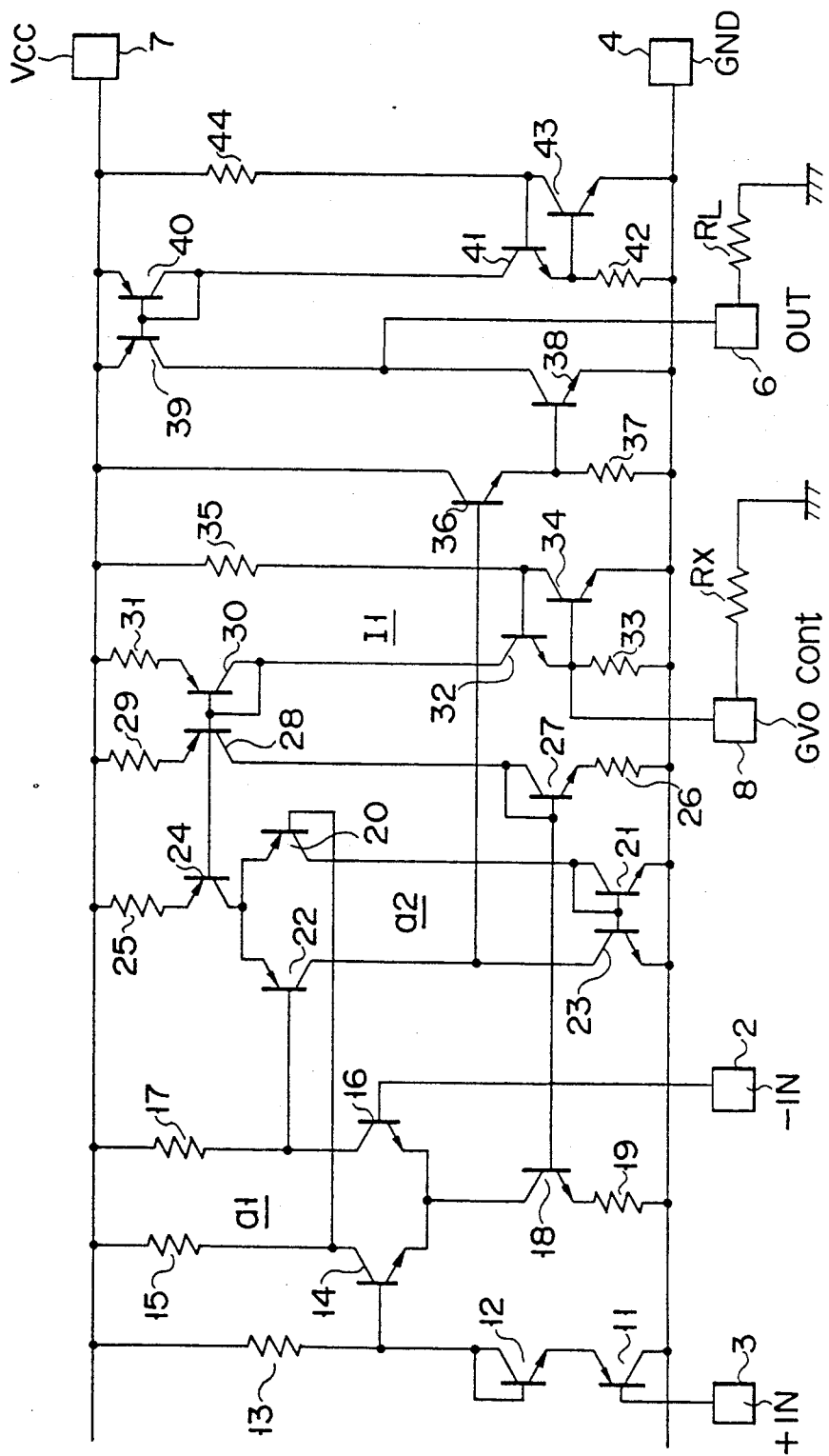
FIG. 2 illustrates a specific circuit arrangement of the op amp of FIG. 1.
Figure 7:
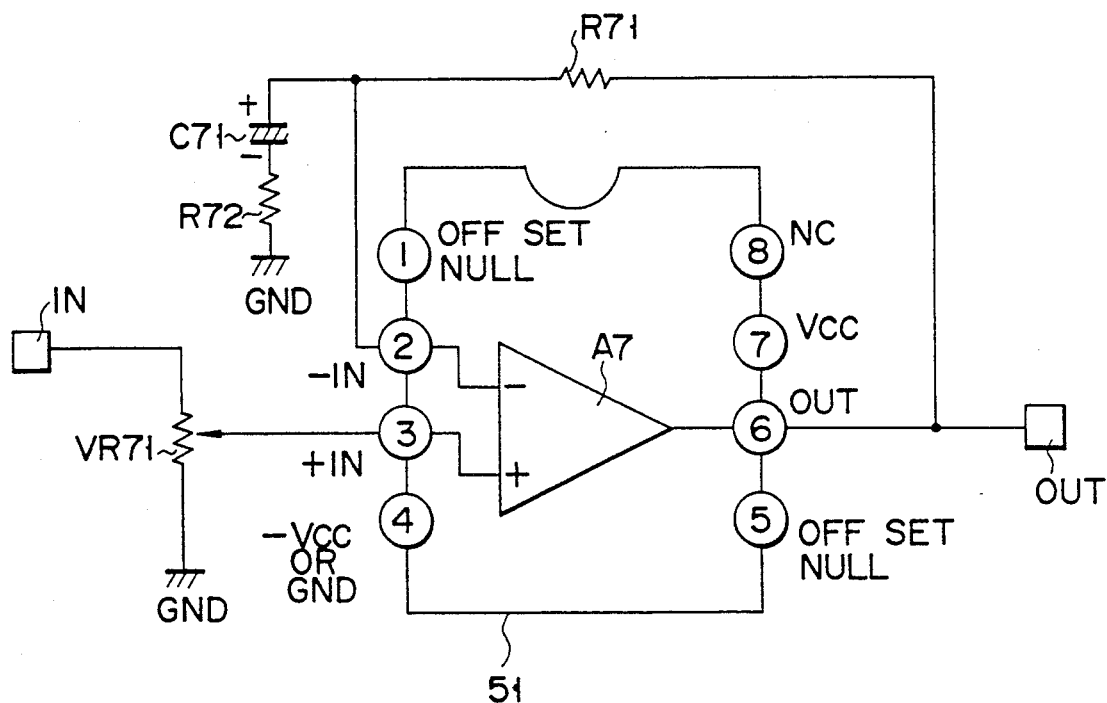
FIG. 7 is a schematic diagram of a prior art amplifier.

FIG. 2 illustrates a specific arrangement of the op amp A1 of FIG. 1.

A PNP transistor 11 has its base connected to the terminal 3 serving as the noninverting input terminal (+IN), its collector connected to the terminal 4 connected to ground GN and its emitter connected to the emitter of an NPN transistor 12. The transistor 12 has its collector shunted to its base and is connected via a resistor 13 to the terminal 7 connected to the supply voltage Vcc. The transistors 11 and 12 and the resistor 13 construct the input stage of the op amp A1.

To the junction between the collector of the transistor 12 and the resistor 13 is connected the base of an NPN transistor 14 the collector of which is connected to the terminal 7 via a resistor 15. The emitter of the transistor 14 is connected to the emitter of an NPN transistor 16 having its base connected to the terminal 2 serving as the inverting input terminal (−IN) and its collector connected to the terminal 7 via a resistor 17. The transistors 14 and 16 and the resistors 15 and 17 form the first amplifier stage a1.

To the emitters of the transistors 14 and 16 is connected the collector of an NPN transistor 18, serving as a current source of the amplifier stage a1, the emitter of which is connected to the terminal 4 via a resistor 19.

To the junction of the collector of the transistor 14 and the resistor 15 is connected the base of a PNP transistor 20 the collector of which is connected to the collector and base of an NPN transistor 21. The emitter of the transistor 21 is connected to the terminal 4.

To the junction of the collector of the transistor 16 and the resistor 17 is connected the base of a PNP transistor 22 having its collector connected to the collector of an NPN transistor 23. The emitter and the base of the transistor 23 are connected to the terminal 4 and to the base of the transistor 21, respectively.

The transistors 20 to 23 form the second amplifier stage a2. The emitters of the transistors 20 and 22 are connected to the collector of a PNP transistor 24 which serves as a current source of the amplifier stage a2. The emitter of the transistor 24 is connected to the terminal 7 via a resistor 25.

The transistor 18, forming the current source of the amplifier stage a1, has its base connected to the base of an NPN transistor 27 which has its emitter connected to the terminal 4 via resistor 26 and its collector connected to its base and the collector of a PNP transistor 28. The emitter of the transistor 28 is connected to the terminal 7 via a resistor 29.

The base of the transistor 28 is connected to the base of the transistor 24 and the base of a PNP transistor 30. The transistor 30 has its emitter connected to the terminal 7 via a resistor 31 and its collector connected to the base of the transistor 30 and the collector of an NPN transistor 32.

The transistor 32 has its emitter connected to the terminal 4 via a resistor 33 and to the base of an NPN transistor 34 and the terminal 8 serving as the Gvo control terminal (Gvo Cont). The transistor 34 has its emitter connected to the terminal 4 and its collector connected to the base of the transistor 32 and the terminal 7 via a resistor 35.

The transistors 32 and 34 and the resistors 33 and 35 form a first current source I1 for supplying currents to the first and second amplifier stages a1 and a2.

The collector of the transistor 22, which serves as the output node of the amplifier stage a2, is connected to the base of an NPN transistor 36. The collector and the emitter of the transistor 36 are connected to the terminal 7 and to the terminal 4 via a resistor 37, respectively. To the junction of the emitter of the transistor 36 and the resistor 37 is connected the base of an NPN transistor 38 having its emitter connected to the terminal 4 and its collector connected to the collector of a PNP transistor 39. The junction of the collectors of the transistors 38 and 39 is connected to the terminal 6 serving as the output terminal OUT.

The transistor 39 has its emitter connected to the terminal 7 and its base connected to the base and collector of a PNP transistor 40. The emitter and collector of the transistor 40 are connected to the terminal 7 and the collector of an NPN transistor 41, respectively. The transistor 41 has its emitter connected to the terminal 4 via a resistor 42. The junction of the emitter of the transistor 41 and the resistor 42 is connected to the base of an NPN transistor 43 which has its emitter connected to the terminal 4 and its collector connected to the base of the transistor 41 and to the terminal 7 via a resistor 44.

In the above circuit arrangement, to the terminal 8 serving as the Gvo control terminal (Gvo Cont) is connected an end of, for example, a resistor Rx serving as the load Zx adapted to adjust Gvo. The other end of the resistor Rx is connected to ground. To the terminal 6 is connected a load resistor RL.

In the above arrangement, the reference current provided from the first current source I1 can be varied by varying the total resistance of a parallel combination of the resistors 33 and Rx. Thereby, the first and second amplifier stages a1 and a2 have their respective emitter currents allowed to vary. That is to say, the mutual conductance gm can be varied by adjusting the resistor Rx, thereby permitting the voltage gain of the amplifier stage a2 and thus the overall Gvo to be varied.

The reference current I1 of the first current source I1 is given by $$I_1 = V_{BE34}/R_{33}/R_x \qquad (1)$$

where VBE34 stands for the base-to-emitter voltage of the transistor 34, R33 stands for the resistance of the resistor 33, Rx stands for the resistance of Rx connected to the Gvo control terminal, and R33//Rx stands for the total resistance of the resistors R33 and Rx connected in parallel.

Assume here that the collector current of a transistor n (n is the number of a transistor shown in FIG. 2) is Icn and that Ic18=Ic24=I1, the open-loop voltage gain Gvo of the circuit shown in FIG. 2 is given by $$G_{VO} = (R_{15} \cdot I_1/V_T) \times (R_{37} \cdot h_{FE36} \cdot I_1/V_T) \times (R_L \cdot I_{E38}/V_T) \quad (2)$$
$$= R_{15} \cdot R_{37} \cdot R_L \cdot h_{FE36} \cdot I_1^2 \cdot I_{E38}/V_T^3$$

where VT is $V_T = kT/q$, q is electronic charge, k is Boltzmann constant, hFEn is the common-emitter current gain of the transistor n and IEn is the emitter current of the transistor n.

FIG. 3 illustrates the circuit shown in FIG. 2 more specifically.

The noninverting input terminal of the op amp A1 is connected to the input terminal IN via the terminal 3. The inverting input terminal of the op amp A1 is connected to the terminal 2. The feedback resistor R41 is connected between the terminal 2 and the output terminal OUT which is connected to the terminal 6. The feedback capacitor C41 and the feedback resistor R42 are connected in series between the terminal 2 and ground, thereby forming a closed loop. To the terminal 8, serving as the Gvo control terminal, is connected an end of the resistor Rx, the other end of which is connected to ground. The load resistor RL is connected between ground and the terminal 6, which is connected to the output terminal OUT.

The closed-loop voltage gain Gv of the circuit is given by $$Gv[dB] = 20 \log (R41 + R42)/R42 \quad (3)$$

By selecting the value of Rx, so that Gvo may become suitable for Gv a constant feedback factor can be obtained.

For example, the open-loop voltage gain Gvo for specific values of the components of the circuit of FIG. 2 as calculated below. Assume the following values hFE=100, Vcc=6V, R33=14k Ω, VBE34=0.7V, RL=10k Ω, R15=R17=10k Ω, R37=3k Ω, R19=R25=R29=R31=R26=500 Ω, and VT=26 mV (at 27° C.).

(a) When the Gvo control terminal 8 is open-circuited, from equation (1) we find that $$I1 = VBE34/R33 = 0.7/14k = 50[\mu A] \quad (4)$$

The open-loop voltage gain Gvo is, from equation (2), $$\begin{aligned}Gvo &= 10k \times 10k \times 3k \times 100 \times (50\ \mu A)^2 \times 500\mu/(26m)^3 \\ &= 14220000 \\ &\approx 126.6\ [dB]\end{aligned} \quad (5)$$

(b) When Rx (=1.6kΩ) is connected to the Gvo control terminal 8, from equation (1) we find that $$R33//Rx = 1.4\ k\Omega \quad (6)$$

$$I1 = 0.7/1.4k = 500\ [\mu A]$$

Gvo is, from equation (2), $$\begin{aligned}Gvo &= 10k \times 10k \times 3k \times 100 \times (500\mu)^3/(26m)^3 \\ &= 213400000 \\ &\approx 166.6\ [dB]\end{aligned} \quad (7)$$

Here, in the circuit of FIG. 2, the closed-loop voltage gain Gv1 is set such that Gv1=20 dB in the case of (a) and is set such that Gv2=60 dB in the case of (b). Then, feedback factors K1 and K2 are $$K1 = 126.6\ dB - 20\ dB = 106.6\ dB \quad (8)$$

$$k2 = 166.6\ dB - 60\ dB = 106.6\ dB \quad (9)$$

As can be seen, by adjusting Gvo using the load Rx connected to the Gvo control terminal, it becomes possible to set the feedback factor to be a constant even if the closed-loop voltage gain is changed. That is, the application of the present invention to a negative feedback amplifier circuit permits the solution of conventional problems encountered in changing the closed-loop voltage gain Gv, such as increase in noise and distortion, deterioration in frequency characteristics and stability against oscillation, etc. Therefore, even if Gv is selected to be any value, Gvo that is most suitable for Gv can be set to allow optimum use of an amplifier circuit.

According to the above embodiment, the resistor Rx connected to the Gvo control terminal can be used to adjust the open-loop voltage gain according to the magnitude of the closed-loop voltage gain. Thus, the input side is free form a noise source because no attenuator is connected to the input terminal and moreover the impedance seen by the input terminal can be made low.

FIG. 4 is a circuit diagram of an amplifier circuit according to a second embodiment of the present invention. In this amplifier circuit, which is substantially the same as the circuit of FIG. 1, the feedback resistor connected between the terminals 2 and 6 is replaced with a variable resistor VRI and the load for adjusting Gvo connected to the Gvo control terminal 8 is replaced with a variable resistor VZx.

In the circuit shown in FIG. 4, the gain is controlled by interlocking the feedback variable resistor VR1 and the Gvo control variable resistor VZx. By the use of such a configuration Gvo suitable for Gv can be obtained readily and hence a constant feedback factor can always be obtained. Also, the circuit is adaptable to various applications because it is low in input impedance and has no noise source.

Moreover, if the output of a preceding-stage amplifier not shown is to be connected to the input terminal (+IN) of the amplifier circuit according to the present embodiment, the connection can be made easily.

FIG. 5 illustrates the circuit of FIG. 4 more specifically. Like reference characters are used to denote corresponding parts to those in FIGS. 3 and 4. The feedback variable resistor VR1 is connected between the terminals 2 and 6. The variable resistor VRx is connected to the Gvo control terminal 8. These variable resistors VR1 and VRx are controlled in an interlocking manner by a control circuit or mechanism not shown.

FIG. 6 illustrates output voltage Vout versus closed-loop voltage gain Gv and open-loop voltage gain Gvo characteristics of the circuit of FIG. 5 when an input signal Vin applied to the input terminal 3 has a constant level.

According to the circuit of FIG. 5, Gvo can be changed simultaneously with a change in Gv. Thus, a suitable open-loop voltage gain Gvo can be obtained and a constant feedback factor can always be held.

Although the preferred embodiments of the present invention have been disclosed and described, it is apparent that other embodiments and modifications are possible.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An amplifier circuit, with an open-loop gain and a closed-loop gain, comprising:
    an operational amplifier having an inverting input terminal, a noninverting input terminal, and an output terminal, said operational amplifier including a current source circuit with a current path providing a current;
    a feedback circuit for feeding a signal output from said output terminal back to said inverting input terminal to set the closed-loop gain of said amplifier circuit; and
    a replaceable load connected to a portion of the current path of said current source circuit for changing the current provided by said current source circuit to set the open-loop gain of said amplifier circuit.

2. An amplifier circuit according to claim 1, in which said feedback circuit comprises a resistor to set the closed-loop gain.

3. An amplifier circuit according to claim 1, in which said replaceable load comprises a resistor.

4. An amplifier circuit according to claim 1, in which said feedback circuit comprises a variable resistor to set the closed-loop gain.

5. An amplifier circuit according to claim 1, in which said feedback circuit comprises a variable resistor.

6. An amplifier circuit according to claim 1, in which said feedback circuit comprises a first variable resistor, with a first resistance, for setting the closed-loop gain, and said replaceable load comprises a second variable resistor, with a second resistance, for changing the open-loop gain, wherein said second resistance is changed in accordance with the first resistance.

7. An amplifier circuit, with a closed-loop gain and an arbitrary open-loop gain, comprising:
    an operational amplifier having an inverting input terminal, a noninverting input terminal, and an output terminal, said operational amplifier including a current source circuit with a current path providing a current;
    a package for housing said operational amplifier, said package having first, second, and third terminals which are connected to said inverting input terminal, said noninverting input terminal, and said output terminal, respectively, and a fourth terminal connected to a portion of the current path of said current source circuit;
    a resistor, connected between said first and third terminals of said package, for feeding a signal output from said output terminal back to said inverting input terminal to set the closed-loop gain of said amplifier circuit; and
    a load connected to said fourth terminal of said package for changing the current provided by said current source circuit to set the arbitrary open-loop gain of said amplifier circuit.

8. An amplifier circuit, with an arbitrary open-loop gain and a closed loop gain, comprising:
    an operational amplifier having an inverting input terminal, a noninverting input terminal, and an output terminal, said operational amplifier including a current source circuit with a current path providing a current;
    a package for housing said operational amplifier, said package having first, second, and third terminals which are connected to said inverting input terminal, said noninverting input terminal and said output terminal, respectively, and a fourth terminal connected to a portion of the current path of said current source circuit;
    a first variable resistor connected between said first and third terminals of said package for feeding a signal output from said output terminal back to said inverting input terminal to set the closed-loop gain of said amplifier circuit; and
    a second variable resistor, connected to said fourth terminal of said package, for changing the current provided by said current source circuit to set the arbitrary open-loop gain of said amplifier circuit.

* * * * *